(12) United States Patent
Fishman et al.

(10) Patent No.: US 10,681,474 B2
(45) Date of Patent: Jun. 9, 2020

(54) LASER-BASED DEVICES UTILIZING IMPROVED SELF-MIX SENSING

(71) Applicant: VocalZoom Systems Ltd., Yokneam Illit (IL)

(72) Inventors: Tal Fishman, Haifa (IL); Tal Bakish, Modi'in (IL)

(73) Assignee: VOCALZOOM SYSTEMS LTD., Yokneam Illit (IL)

( * ) Notice: Subject to any disclaimer, the term of this patent is extended or adjusted under 35 U.S.C. 154(b) by 138 days.

(21) Appl. No.: 15/708,644

(22) Filed: Sep. 19, 2017

(65) Prior Publication Data

US 2019/0090068 A1     Mar. 21, 2019

(51) Int. Cl.
| | |
|---|---|
| H04R 23/00 | (2006.01) |
| H01S 5/187 | (2006.01) |
| H04R 23/02 | (2006.01) |
| H01S 5/00 | (2006.01) |
| H01S 5/183 | (2006.01) |
| H01S 5/042 | (2006.01) |
| H01S 5/42 | (2006.01) |
| H04R 1/10 | (2006.01) |
| H04R 3/00 | (2006.01) |

(52) U.S. Cl.
CPC ......... *H04R 23/008* (2013.01); *H01S 5/0028* (2013.01); *H01S 5/0425* (2013.01); *H01S 5/187* (2013.01); *H01S 5/18344* (2013.01); *H01S 5/18361* (2013.01); *H04R 23/02* (2013.01); *H01S 5/18341* (2013.01); *H01S 5/423* (2013.01); *H04R 1/1083* (2013.01); *H04R 3/005* (2013.01); *H04R 2499/11* (2013.01)

(58) Field of Classification Search
CPC .. H01S 5/0028; H01S 5/0425; H01S 5/18344; H01S 5/18361; H01S 5/187; H01S 5/18341; H01S 5/423; H04R 23/008; H04R 23/02; H04R 1/1083
See application file for complete search history.

(56) References Cited

U.S. PATENT DOCUMENTS

| | | | |
|---|---|---|---|
| 6,574,257 B1 * | 6/2003 | Thronton | B82Y 10/00 250/216 |
| 2018/0132042 A1 * | 5/2018 | Fishman | H04R 3/005 |

* cited by examiner

*Primary Examiner* — Armando Rodriguez
(74) *Attorney, Agent, or Firm* — Eitan Mehulal Sadot

(57) ABSTRACT

A device has a laser unit, which includes: a top-side p-type DBR region; which is on top of and in direct touch with an active region; which is on top of and in direct touch with a bottom-side n-type Distributed Bragg Reflector (DBR) region; which is on top of a n-type substrate. The laser unit further includes a voltage measurement anode touching or being in proximity to a top surface of the active region; and a voltage measurement cathode touching or being in proximity to a bottom surface of the active region. The voltage between the voltage measurement anode and the voltage measurement cathode is directly measured; and is utilized for determining characteristics of a laser self-mix signal of the laser unit, without having or using a monitor photodiode.

24 Claims, 8 Drawing Sheets

LASER-BASED DEVICES UTILIZING IMPROVED SELF-MIX SENSING

FIELD OF THE INVENTION

The present invention relates to the field of devices that utilize laser beams.

BACKGROUND OF THE INVENTION

Millions of people worldwide utilize a variety of electronic devices that may receive, capture or otherwise process audio signals. For example, cellular phones and smartphones comprise an audio microphone, allowing a user to conduct a telephone call with a remote user. Similarly, a smartphone typically comprises an audio microphone and a video camera, allowing the user to record an audio/video clip. Additionally, many laptop computers as well as tablets are typically equipped with an audio microphone able to capture audio.

Unfortunately, an audio microphone typically captures a desired audio signal (e.g., a voice of a human speaker) together with background noise, interferences, ambient noises, environmental noises, and/or audio from other non-desired sources.

SUMMARY OF THE INVENTION

Some embodiments of the present invention may comprise systems, devices, and method that utilize a laser beam, or multiple laser beams, able to perform self-mix or self-mix, or self-mixing interferometry in an enhanced or improved manner, or able to produce or utilize improved laser-based self-mix sensing, or having increased sensing capabilities for self-mix functionality or self-mix applications.

The present invention may provide other and/or additional advantages and/or benefits.

DETAILED DESCRIPTION OF SOME EMBODIMENTS OF THE INVENTION

Figure 1A:
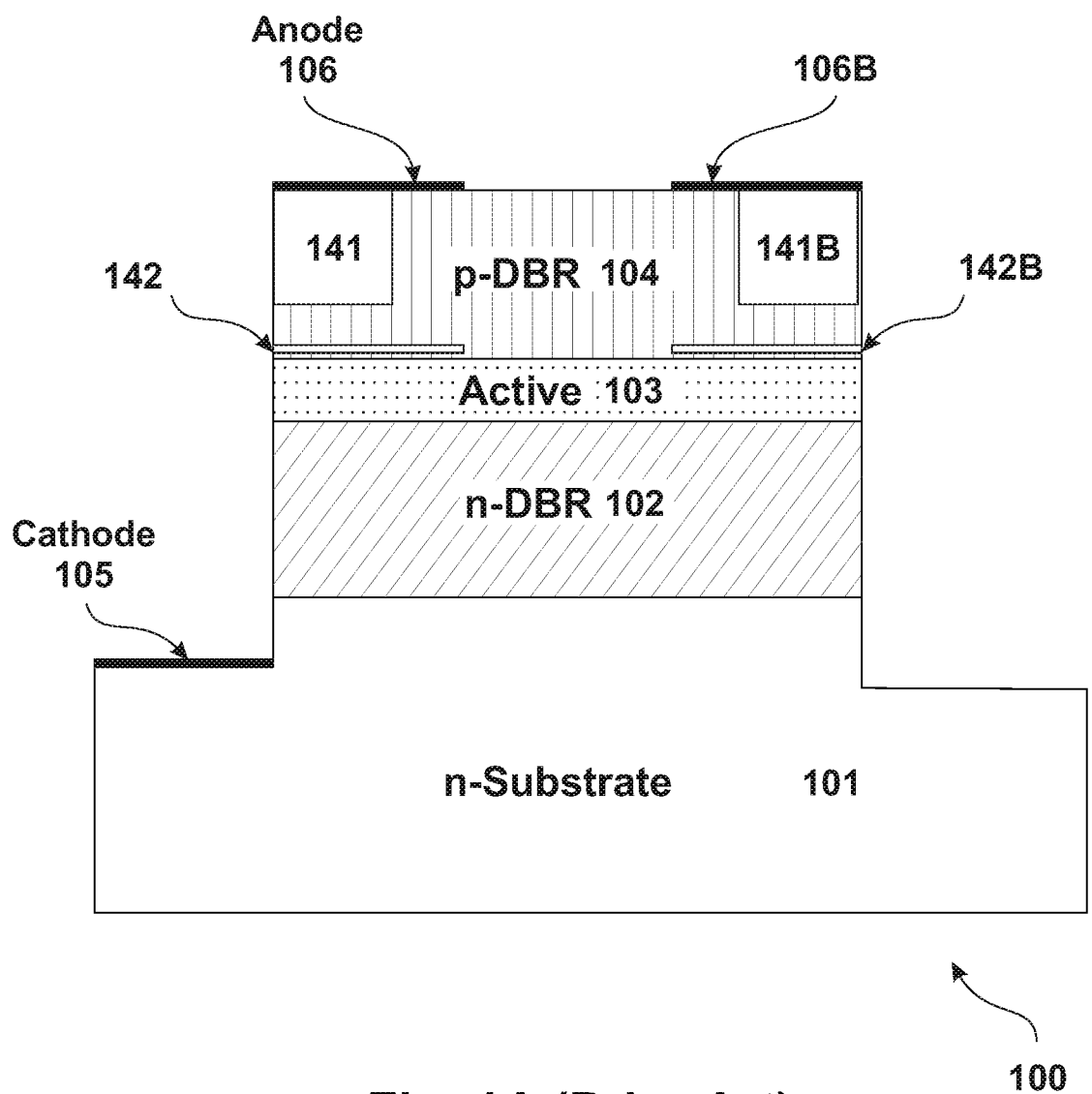
FIGS. 1A and 1B are schematic illustrations of a prior art laser structure.

The present invention utilizes a laser or laser-based system, for example, a laser drive, a laser driver, a laser transmitter, and/or other laser or lased-based units. For example, a laser beam is generated and transmitted towards a remote target; e.g., towards a face or face-area of a human speaker. The laser beam hits the target, and is reflected back off the target. The reflected optical feedback, or at least a portion thereof, is received back into the laser. The reflected beam mixes with the already existing internal beam of the laser (e.g., changing the laser gain), and modifies the laser output power. For example, the mixing or self-mixing may modify, increase or decrease the laser output power, depending on constrictive or destructive feedback phase, which in turn depends on the target's distance (e.g., including, but not limited to, the exact distance from a facial skin due to minuscule vibrations of the skin of a human speaker). The modified self-mix power (e.g., the self-mix laser output power) is detected by monitor photo-diode (MPD) or photo-detector and may be referred to as a self-mix signal. The self-mix signal and its characteristics are analyzed or are determined by a spectral analysis unit. The self-mix signal and its characteristics are indicative of the speed and/or distance and/or movement speed and/or vibration speed and/or vibrations characteristics of the target; e.g., the speed of movement of a facial skin portion of the human speaker that was hit by the laser beam and reflected it back to the laser transmitter. The self-mix signal may be utilized for one or more purposes; for example, as a voice sensor or voice detector, to improve or enhance an acoustic signal or an audio signal (e.g., captured simultaneously by one or more acoustic microphones), and/or other systems that utilize remote speed detection or measurement, or remote vibration-speed detection or measurement.

Accordingly, a laser device or a semi-conductor laser unit may remotely sense target speed and/or distance and/or vibrations, utilizing self-mixing effect which generates laser power oscillation that is proportional to the target speed and distance. The change in laser power, for example, monitored by the MPD or photo-detector, outputs a changing electric current signal which is transformed or converted or translated into the estimated speed of movement (or vibration) of the target, via Fast Fourier Transform (FFT) and/or other transformation(s) and/or spectral analysis process, measuring or determining the Self-Mix (SM) oscillation rate. The SM signal characteristics may be used in order to estimate (or to improve or enhance) audio or acoustic signal(s) that were uttered or generated by the target (the human speaker), and/or in order to reduce or mitigate noise or interference or ambient acoustic signals (e.g., from the environment, from other humans, from a noise source). For example, if the self-mix signal indicates that no vibrations are detected at the human target, then an acoustic or audio sample that was captured at that time may be classified as noise or interference.

The MPD is positioned or located such that is collects at least some (but typically not all) of the oscillating laser power. The MPD may be monolithically integrated with the laser transmitter; or, the MPD may a separate unit that is separate and non-integrated with the laser transmitter. The MPD monitors the back-side laser emission, or monitors the front-side laser emission (e.g., by using a beam-splitter).

The Applicants have realized that the utilization of MPD may cause one or more challenges, for example: (a) some non-negligible percentage of the light is subtracted from (or lost, or discarded by) the SM process; (b) mechanical challenge: implementing the front-side beam splitter or the back-side configuration may be complicated and may add noise, spurious back-reflections, and/or low yield to the system; (c) when utilizing a multiple-laser array or matrix or set, multiple different MPD units may be used (e.g., a different or separate MPD for each laser), thereby causing mechanical implementation to be even more difficult or sometimes even impossible due to size constraints or form-factor constraints or MPD location/position constraints.

The Applicants have realized that an alternate implementation may be utilized in some laser-based devices, for example, as an alternative for utilizing an MPD for the self-mix signal measurement or sensing. For example, the voltage of the laser may be measured, and the voltage of the laser may be proportional to the self-mix signal or to a particular characteristic of the self-mix signal. However, the Applicants have realized that laser voltage measurement may be inaccurate or may be prone to noise, for example, due to large series resistance.

The Applicants have devised an innovative structure and architecture and system, that may solve or mitigate the problem of large serial resistance for self-mix voltage measurement; thereby reducing the corresponding large noise in such a configuration in which laser voltage is measured (e.g., instead of utilizing a MPD; or, in addition to utilizing a MPD; or, in a hybrid system in which a first laser utilizes a MPD and a second co-located laser utilizes laser voltage measurement instead of MPD). Accordingly, the present invention enables the use of laser voltage measurement instead of necessarily utilizing an MPD for self-mix signal monitoring and characterizing.

Figure 1B:
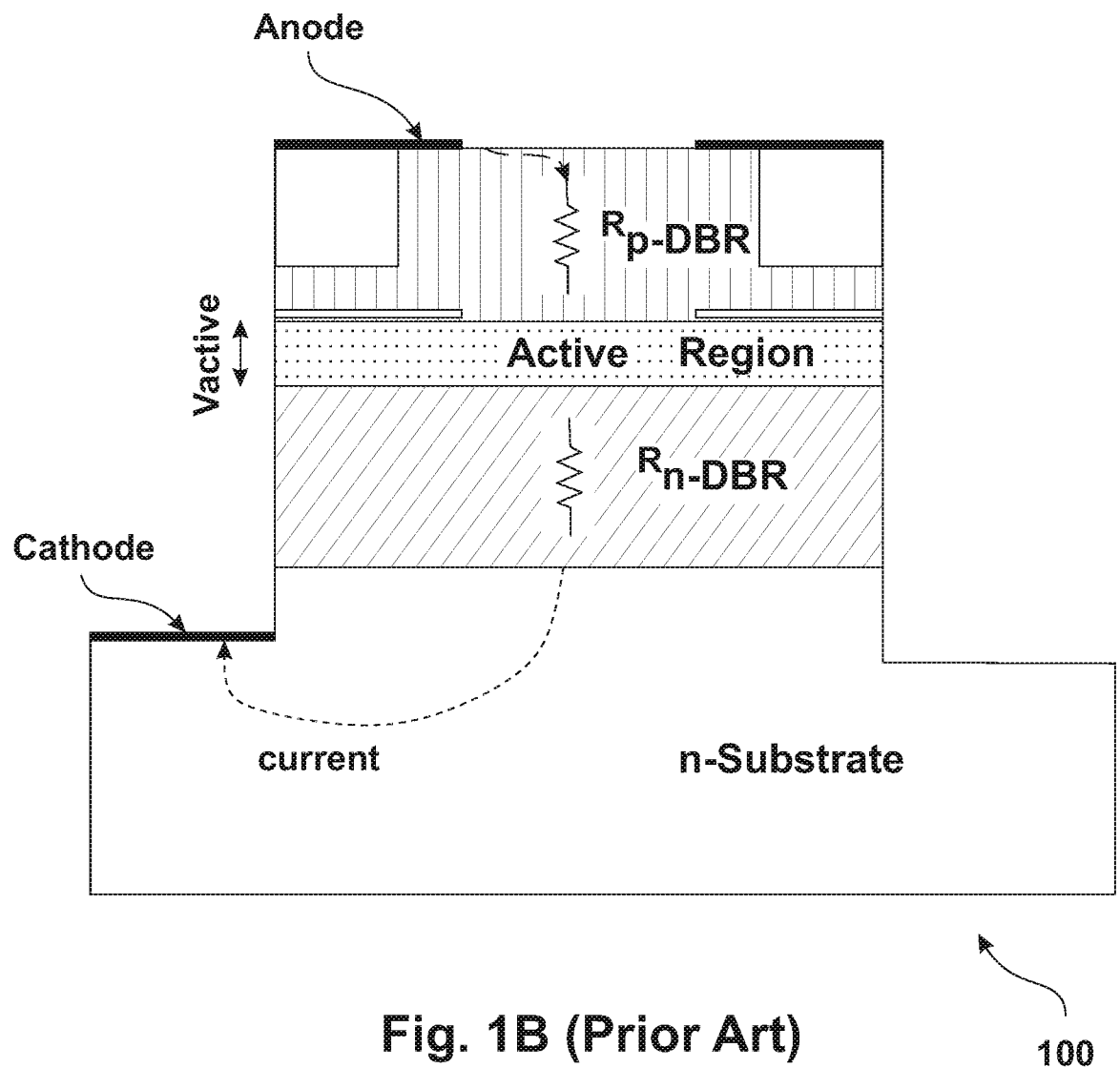

Reference is made to FIGS. 1A and 1B, which are schematic illustrations of a prior art laser structure 100; which comprises: a n-type substrate 101; a bottom n-type Distributed Bragg Reflector (DBR) layer 102; an active region 103; a top p-type DBR layer 104; and a corresponding bottom Cathode Contact 105 and top Anode Contact 106 that are connected (respectively) to the n side and the p side. The contacts 105-106 supply the current (I) to the Laser Diode (ILD) that provides a lasing gain to the active region 103. The contacts 105-106 may be connected to a current source and/or to the laser driver. The resulting voltage between the Anode Contact 106 and the Cathode Contact 105, denoted Vtotal, is a sum of the voltages that develop on the various regions in the current path, as demonstrated in FIG. 1B. Apart from the active voltage, denoted Vactive, a contribution to the resulting voltage Vtotal comes from the p-DBR resistance, denoted Rp-DBR. Also shown are Current Limiting Zone (141, 141B) and Oxidation Layer (142, 142B) (or oxidation region).

The Applicants have realized that in order to monitor the self-mix signal and/or in order to analyze or determine its characteristics, the value of Vactive should be measured. However, a conventional system could only measure, at most, the Vtotal which is the sum of all the voltage contributions. The Applicants have further realized that noise contribution is large, due to current flow via the DBR (and particularly the top p-type DBR); and/or due to fundamental Johnson Noise; and/or due to low frequency noise (1/f noise). The Applicants have realized that the large noise is present due to the complex band structure of the DBR; and that it may be beneficial or advantageous to measure or detect or determine particularly and/or directly the value of Vactive.

It is noted that FIG. 1A and FIG. 1B depict a cut-through (or cross-section) side-view of the laser structure 100, which may in reality be a three-dimensional object which may be structured similarly to a bagel shape or doughnut shape or ring shape; such that right-to-left symmetry may be attributed to elements shown in FIG. 1A and FIG. 1B, and such that elements shown on the right side are three-dimensionally connected to corresponding elements shown on the left side); for example, such that Anode 106B corresponds to Anode 106, and such that Current Limiting Zone 141B corresponds to Current Limiting Zone 141; and such that Oxidation Layer 142B (for limiting the optical aperture) corresponds to Oxidation Layer 142.

Figure 2A:
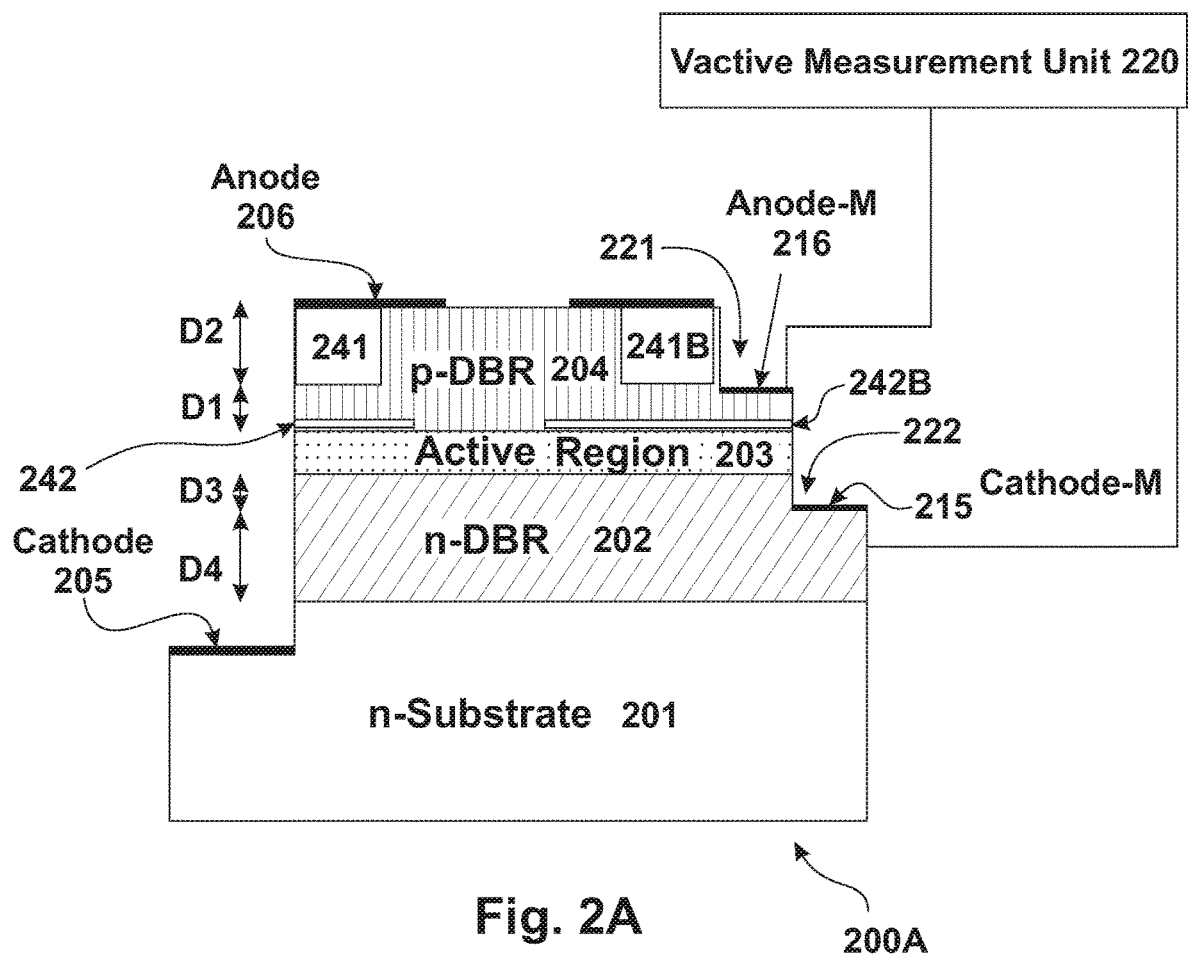
FIG. 2A is a schematic illustration of a laser unit, in accordance with some demonstrative embodiments of the present invention.

Reference is made to FIG. 2A, which is a schematic illustration of a laser unit 200A in accordance with some demonstrative embodiments of the present invention. Laser unit 200A is able to directly measure or to directly determine the Vactive voltage. Laser unit 200A may be implemented as a Vertical-Cavity Surface-Emitting Laser (VCSEL).

Laser unit 200A comprises: a n-type substrate 201 (for example, formed of n doped GaAs); a bottom n-type Distributed Bragg Reflector (DBR) layer 202 (for example, formed of n doped GaAs/Al$_x$Ga$_{1-x}$As); an active region 203 or active layer (for example, formed of three 8-nanometer-thick In$_{xx}$Ga$_{1-x}$As sandwiched between (or surrounded by, or encapsulated by) two $\lambda$/4 GaAs layers and additional two $\lambda$/4 Al$_{0.2}$Ga$_{0.8}$As, such that the total thickness of the active layer (or active region) is $\lambda$), wherein in some embodiments the active layer (or active region) is also doped, so that above the Quantum Well(s) (QW) it is p-type whereas below the QW is n-type); a top p-type DBR layer 204 (for example, formed of p doped GaAs/Al$_x$Ga$_{1-x}$As); and a corresponding bottom Cathode Contact 205 and top Anode Contact 206 that are connected (respectively) to the n side and the p side. The contacts 105-106 may be connected to a current source and/or to the laser driver.

The contacts 205-206 may be formed of layers of Ni, Ti, Pt, Zn, Al, and/or Au, and they supply the Current to the Laser Diode (ILD) that provides a lasing gain to the active region 203. The resulting voltage between the Anode Contact 206 and the Cathode Contact 205, denoted Vtotal, is a sum of the voltages that develop on the various regions in the current path. Apart from the active voltage, denoted Vactive, a contribution to the resulting voltage Vtotal comes from the p-DBR resistance, denoted Rp-DBR.

It is noted that the above-mentioned or the herein-mentioned materials are only non-limiting examples, and other suitable material(s) or combinations of materials may be used to form or to produce a VCSEL in accordance with the present invention. In some embodiments, the Anode Contact 206 is formed of a first group (or combination) of materials, whereas the Cathode Contact 205 is formed of a second, different, group (or combination) of materials.

Two additional or supplemental contacts are introduced and are comprised in the laser unit 200A; for example, a Vactive Measurement Cathode Contact 215 and a Vactive Measurement Anode Contact 216, which may be formed of Ni, Ti, Zn, Al and/or Au. They are located immediately adjacent to the two opposites sides of the active region 203; or, Contact 215 directly touches (or is in direct contact with, or is immediately coupled to) the top surface (the p side) of active region 203, whereas Contact 215 touches (or is in direct contact with, or is immediately coupled to) the bottom surface (the n side) of active region 203. The two supplemental contacts 215-216 may also be referred to as Monitoring Contacts or Monitoring Electrodes, or as voltage measuring contacts, or as voltage measuring electrodes; or as Anode-M and Cathode-M (where M stands for Monitoring), to distinguish them from conventional contacts (e.g., 205 and 206) or other conventional electrodes of a laser unit.

In some embodiments, optionally, in order to facilitate or enable the direct measurement of Vactive by a Vactive Measurement Unit 220 (e.g., implemented by a Low Noise Amplifier (LNA) and an Analog to Digital (A/D converter), the physical structure of the laser unit 200A may be structured in a tapered pattern or in a stairs pattern or in a step pattern; for example, having a top-step region 221 and a bottom-step region 222, in which a portion of the respective layer or region is discarded or is removed or is etched away to make room for the supplemental Contacts 215-216 and to facilitate the measurement of Vactive through them.

In accordance with the present invention, the supplemental Contacts 215-216 are connected directly to the n layer and to the p layers (respectively) in the vicinity of the active layer 203 or in immediate proximity to the active layer. In such implementation, the serial resistance is very low or is negligible, and the Jonson Noise is reduced or mitigated or eliminated. Additionally or alternatively, no current flows through the supplemental contacts 215-216 (which can also be called Monitoring Contacts), and thus low-frequency noise (1/f noise) is expected to be insignificant or negligible or eliminated.

In some embodiments, the following parameters may be used to denote the distance (e.g., the shortest distance) between two points or two lines: distance D1 between the supplemental Anode Contact 216 and the top-surface of the active region 203; distance D2 between the supplemental Anode Contact 216 and the top-surface of the p-DBR layer; distance D3 between the supplemental Cathode Contact 215 and the bottom-surface of the active region 203; distance D4 between the supplemental Cathode Contact 215 and the bottom-surface of the n-DBR layer.

In some embodiments, for example, the ratio between distance D1, and the cumulative distances D1+D2, is denoted K1; wherein K1 is, for example, not more than 0.05, or not more than 0.10, or not more than 0.15, or not more than 0.20, or not more than 0.25, or not more than 0.30, or not more than 0.30, or not more than 0.33, or not more than 0.35, or not more than 0.40, or not more than 0.45, or not more than 0.50.

In some embodiments, for example, the ratio between distance D3, and the cumulative distances D3+D4, is denoted K2; wherein K2 is, for example, not more than 0.05, or not more than 0.10, or not more than 0.15, or not more than 0.20, or not more than 0.25, or not more than 0.30, or not more than 0.30, or not more than 0.33, or not more than 0.35, or not more than 0.40, or not more than 0.45, or not more than 0.50.

In some embodiments, the ratio K1 is identical to the ratio K2. In other embodiments, the ratio K1 is different from the ration K2.

In some embodiments, the laser unit 200A in accordance with the present invention may be implemented as a VCSEL having Bragg mirror(s) or DBR element(s), such that each Bragg mirror (or each DBR element) is approximately 25 to 35 layers thick; the thickness of each layer may be, for example, approximately $\lambda_0/4/n_i$ (wherein $\lambda_0$ is the free space laser wavelength, for example 940 nanometers and $n_i$ the refractive index of the $i_{th}$ layer) which is approximately 59 nanometers, or may be approximately 55 or 60 or 65 nanometers, or may be in the range of 50 to 75 nanometer, or may be in the range of 50 to 80 or 50 to 90 or 50 to 100 nanometers; other suitable layer-thickness values may be used. In some embodiments, each DBR layer is a combination of sub-layers, such that $n_i$ is the average refractive index the combination of sub-layers.

In some embodiments, the Vactive Measurement Cathode Contact 215 may be located at a distance of exactly L1 layers from the top-most layer (or the top-most surface) of the n-DBR 202; wherein L1 may be, for example, equal to 1, or equal to 2, or equal to 3, or equal to 4, or equal to 5, or equal to 6, or may be in the range of 0 to 10, or may be in the range of 1 to 7, or may be in the range of 3 to 5.

In some embodiments, the Vactive Measurement Cathode Contact 215 may be located at a distance of exactly or approximately N1 nanometers from the top-most layer (or the top-most surface) of the n-DBR 202; wherein N1 may be, for example, 150 nanometers, 180 nanometers, 200 nanometers, 250 nanometers, 300 nanometers, 350 nanometers, 400 nanometers, or N may be in the range of 150 to 400 nanometers, or N may be in the range of 180 to 300 nanometers.

In some embodiments, the Vactive Measurement Anode Contact 216 may be located at a distance of exactly L2 layers from the lowest layer (or the lowest surface) of the p-DBR 204; wherein L2 may be, for example, equal to 1, or equal to 2, or equal to 3, or equal to 4, or equal to 5, or equal to 6, or may be in the range of 0 to 10, or may be in the range of 1 to 7, or may be in the range of 3 to 5.

In some embodiments, the Vactive Measurement Anode Contact 216 may be located at a distance of exactly or approximately N2 nanometers from the lowest layer (or the lowest surface) of the p-DBR 204; wherein N2 may be, for example, 150 nanometers, 180 nanometers, 200 nanometers, 250 nanometers, 300 nanometers, 350 nanometers, 400 nanometers, or N may be in the range of 150 to 400 nanometers, or N may be in the range of 180 to 300 nanometers.

In some embodiments, N1 is equal to N2, and L1 is equal to L2.

In other embodiments, N1 is greater than N2; and/or L1 is greater than L2.

In other embodiments, N2 is greater than N1; and/or L2 is greater than L1.

In some embodiments, the ratio of N1/N2 is in the range of 0.95 to 1.05, or is in the range of 0.90 to 1.10, or is in the range of 0.85 to 1.15, or is in the range of 0.80 to 1.20, or is in the range of 0.75 to 1.25. In some embodiments, the ratio of L1/L2 is in the range of 0.95 to 1.05, or is in the range of 0.90 to 1.10, or is in the range of 0.85 to 1.15, or is in the range of 0.80 to 1.20, or is in the range of 0.75 to 1.25.

In some embodiments, the distance or the shortest-distance of a Contact (215, 216) from its respective oxidation layer, may be measured by counting the DBR layers; and a suitable production process may be used to achieve such distance, for example, by performing selective and highly-accurate etching of layer(s) and/or material(s), or by performing a layers-etching process that is stopped or paused at a precise location or depth or distance in order to enable the production or the addition of the Contact (215, 216) there.

Embodiments of the present invention may comprise other suitable implementations, in which a laser self-mix signal is sensed and/or characterized and/or analyzed (e.g., with less or no noises) based on direct measurement of the Vactive voltage (e.g., and not by characterizing the Optical power); for example, though a hole or cavity or recess or stepped-recess or other accessible venue or tunnel or via, which is etched or drilled or otherwise formed, to bypass one or more regions or layers or sub-units of the VCSEL and to directly measure the Vactive voltage as close as possible (or even, directly touching) the active layer.

In some embodiments, in order to achieve an accurate depth(s) of the Vactive Measurement Cathode Contact 215 (the Anode-M) and the Cathode-M and the Vactive Measurement Anode Contact 216 (the Anode-M), a thin etch-stop layer (e.g., of AlAs, or other suitable material) may be inserted in the process of Metal-Organic Chemical Vapour Deposition (MOCVD) layer grow at the suitable location. Such etch-stop layer has extremely low etching rate compared to other materials in the assembly (e.g., GaAs) when a suitable etchant is utilized, and therefore it stops the etching process at a particular depth which is very accurate.

In some embodiments, the Vactive Measurement Anode Contact 216 is parallel or is generally-parallel to the longest-dimension of the p-DBR layer (or, to the top-surface or the top-layer of the p-DBR layer; or, to the bottom-surface or the lowest-surface of the p-DBR layer). In some embodiments, the Vactive Measurement Cathode Contact 215 is parallel or is generally-parallel to the longest-dimension of the n-DBR layer (or, to the top-surface or the top-layer of the n-DBR layer; or, to the bottom-surface or the lowest-surface of the n-DBR layer). Such non-slanted, or parallel, or generally-parallel, structure is demonstrated in FIG. 2A.

In some embodiments, the Vactive Measurement Anode Contact 216 (the Anode-M) and the Vactive Measurement Cathode Contact 215 (Cathode-M) are located within the Active Layer (or active region) p-type side and n-type side, respectively.

Figure 2B:
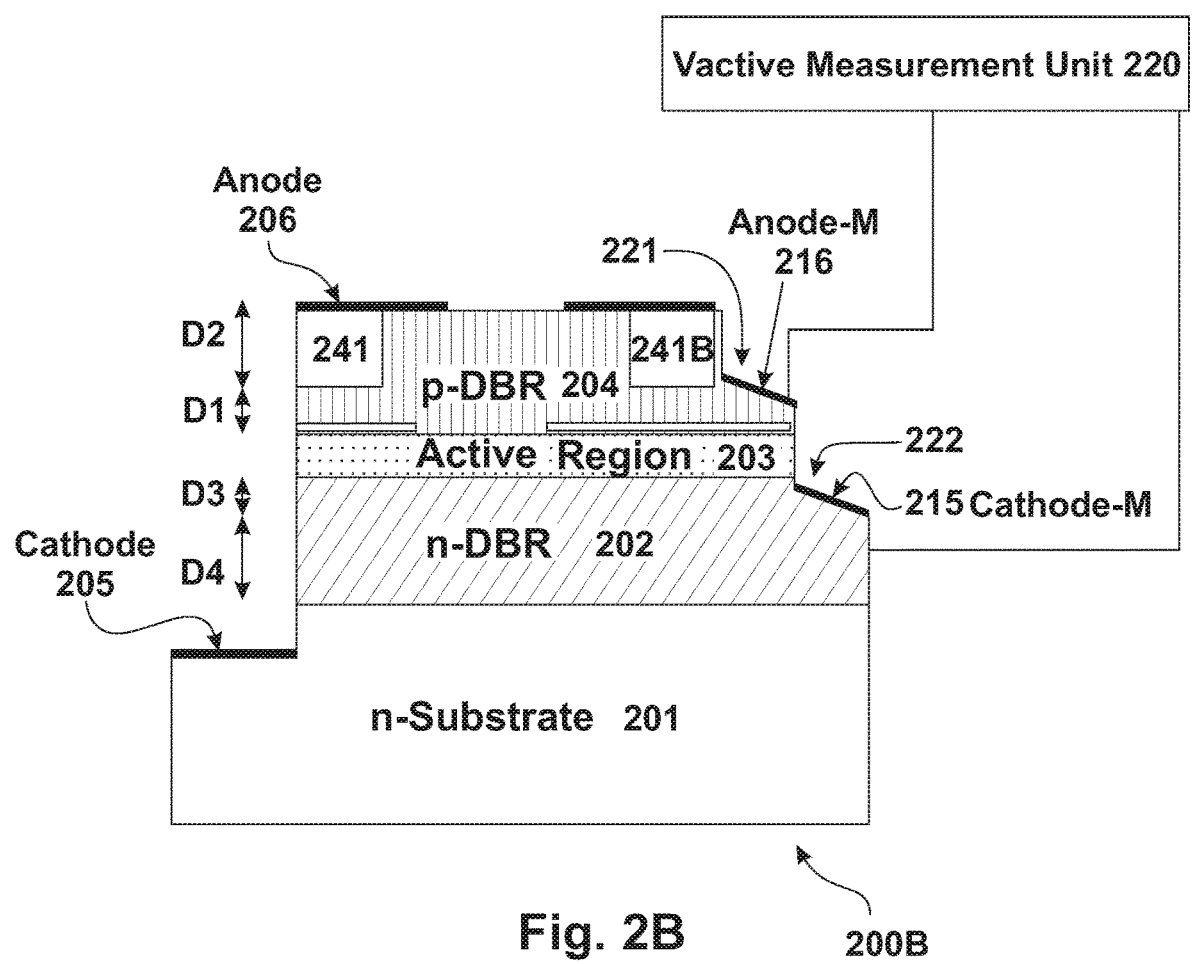
FIG. 2B is a schematic illustration of another laser unit, in accordance with some demonstrative embodiments of the present invention.

Reference is made to FIG. 2B, which is a schematic illustration of another laser unit 200B in accordance with some demonstrative embodiments of the present invention. Laser unit 200B is able to directly measure or to directly determine the Vactive voltage. Laser unit 200B may be implemented as a Vertical-Cavity Surface-Emitting Laser (VCSEL). Laser unit 200B may be generally-similar to laser unit 200A; however, whereas in laser unit 200A each one of the two Vactive Measurement Contacts (namely, the Vactive Measurement Anode Contact 216 and the Vactive Measurement Cathode Contact 215) is parallel or generally-parallel relative to the nearest (or respective) DBR layer, in laser unit 200B each one of the two Vactive Measurement Contacts (namely, the Vactive Measurement Anode Contact 216 and the Vactive Measurement Cathode Contact 215) is non-parallel and is slanted or is outwardly-slanted relative to the nearest (or respective) DBR layer or DBR surface.

Figure 2C:
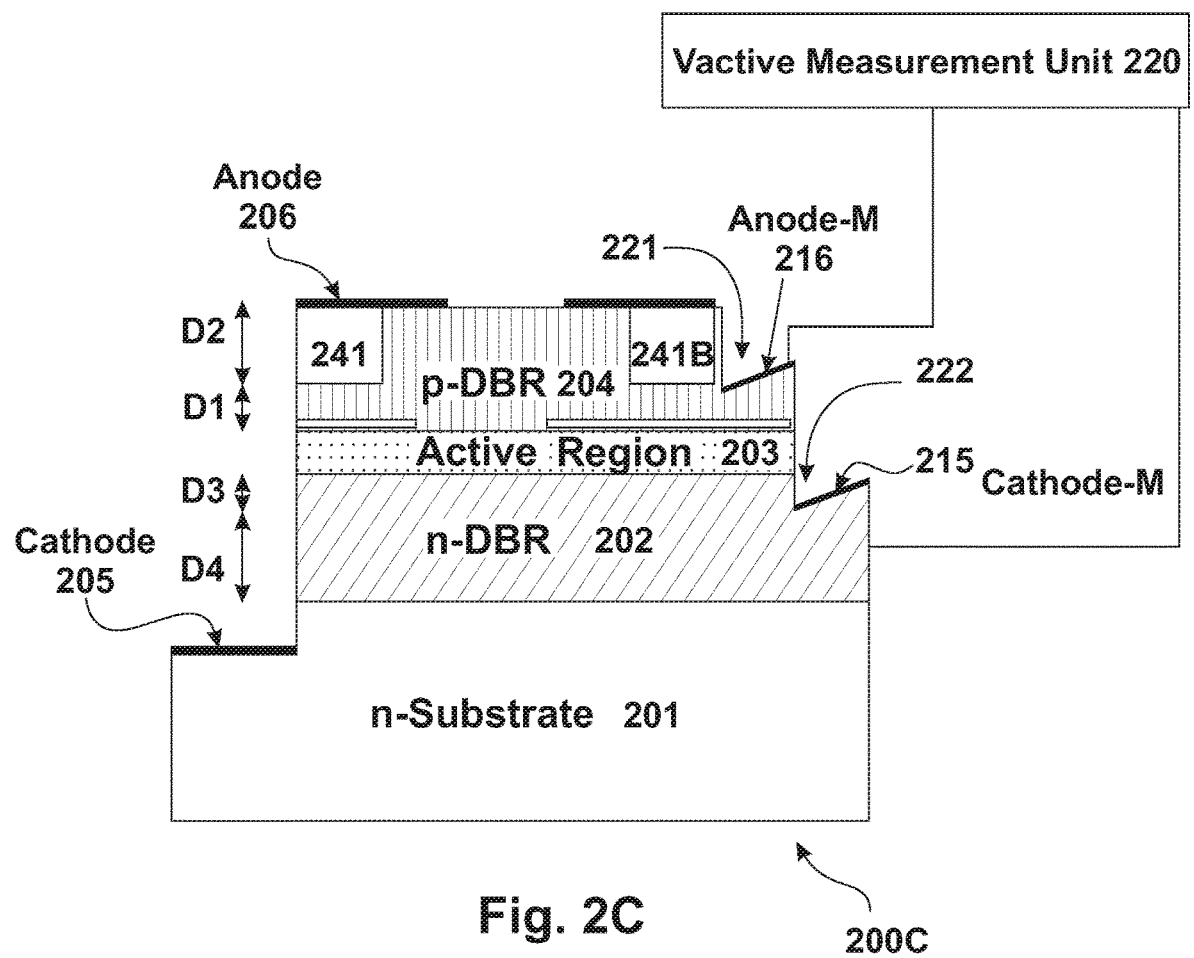
FIG. 2C is a schematic illustration of still another laser unit, in accordance with some demonstrative embodiments of the present invention.

Reference is made to FIG. 2C, which is a schematic illustration of another laser unit 200B in accordance with some demonstrative embodiments of the present invention. Laser unit 200B is able to directly measure or to directly determine the Vactive voltage. Laser unit 200C may be implemented as a Vertical-Cavity Surface-Emitting Laser (VCSEL). Laser unit 200C may be generally-similar to laser unit 200A; however, whereas in laser unit 200A each one of the two Vactive Measurement Contacts (namely, the Vactive Measurement Anode Contact 216 and the Vactive Measurement Cathode Contact 215) is parallel or generally-parallel relative to the nearest (or respective) DBR layer, in laser unit 200C each one of the two Vactive Measurement Contacts (namely, the Vactive Measurement Anode Contact 216 and the Vactive Measurement Cathode Contact 215) is non-parallel and is slanted or is inwardly-slanted relative to the nearest (or respective) DBR layer or DBR surface.

Referring again to FIGS. 2A, 2B and 2C, it is clarified that any suitable combination of mixture of slanted and/or non-slanted Vactive Measurement Contacts (215, 216) may be used in the same laser unit (200A, 200B, 200C, or other suitable and similar laser unit). For example, a single VCSEL or a single laser unit may comprise: an inwardly-slanted Vactive Measurement Cathode Contact 215 with an outwardly-slanted Vactive Measurement Anode Contact 216; or may comprise an outwardly-slanted Vactive Measurement Cathode Contact 215 with an inwardly-slanted Vactive Measurement Anode Contact 216; or may comprise an outwardly-slanted Vactive Measurement Cathode Contact 215 with a non-slanted Vactive Measurement Anode Contact 216; or may comprise an inwardly-slanted Vactive Measurement Cathode Contact 215 with a non-slanted Vactive Measurement Anode Contact 216; or may comprise an outwardly-slanted Vactive Measurement Anode Contact 216 with a non-slanted Vactive Measurement Cathode Contact 215; or may comprise an inwardly-slanted Vactive Measurement Anode Contact 216 with a non-slanted Vactive Measurement Cathode Contact 215. Other suitable structures may be used.

Figure 3A:
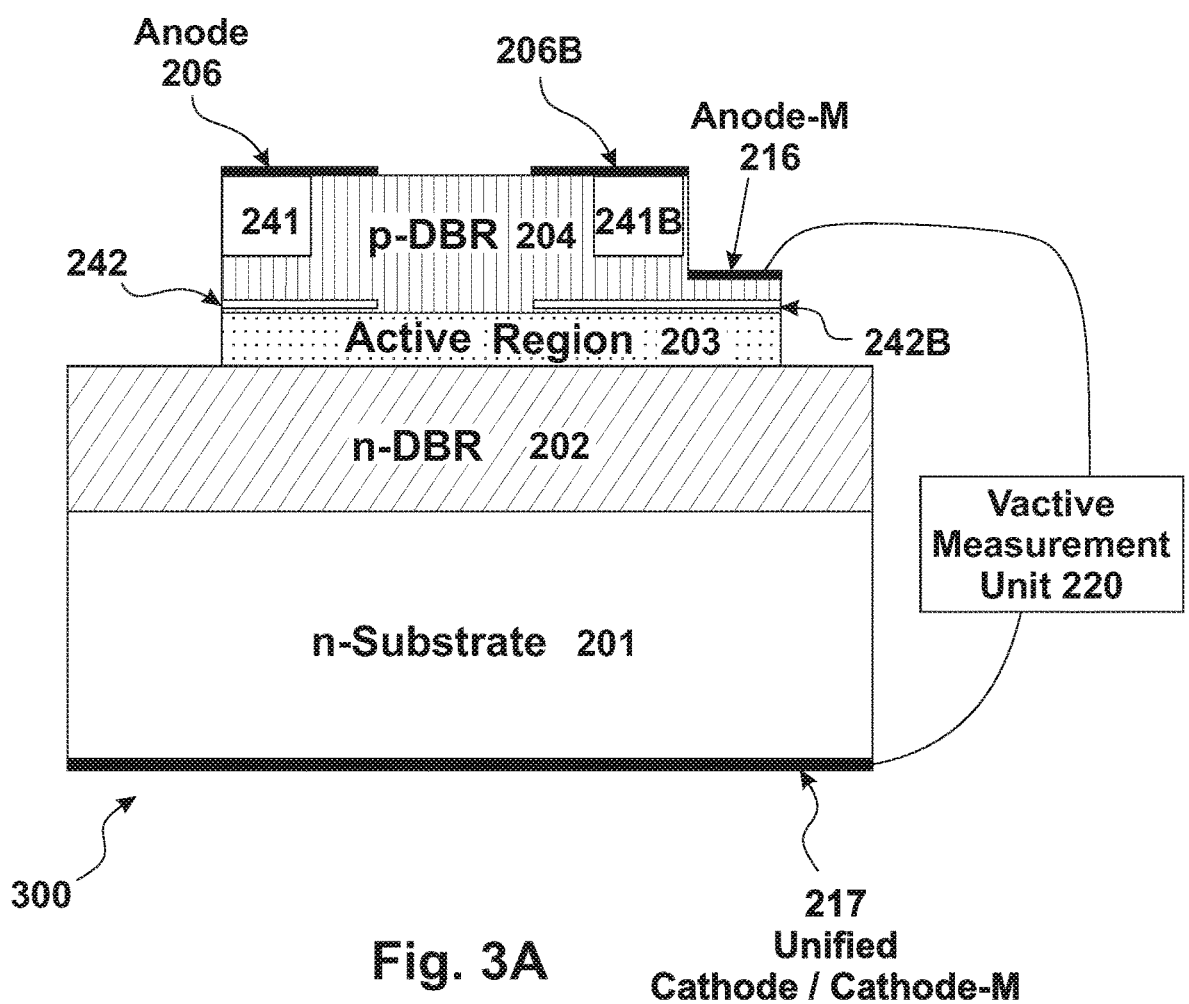
FIG. 3A is a schematic illustration of yet another laser unit, in accordance with some demonstrative embodiments of the present invention.

Reference is made to FIG. 3A, which is a schematic illustration of another laser unit 300A in accordance with some demonstrative embodiments of the present invention. Laser unit 300A is able to directly measure or to directly determine the Vactive voltage. Laser unit 300A may be implemented as a VCSEL. Laser unit 300 may be generally-similar to laser unit 200A; however, whereas in laser unit 200A each one of the two Vactive Measurement Contacts (namely, the Vactive Measurement Anode Contact 216 and the Vactive Measurement Cathode Contact 215) is implemented as a separate or stand-alone contact (e.g., relative to the conventional Cathode Contact 205 and the conventional Anode Contact 206), laser unit 300A features a different structure: only a single supplemental contact is introduced as a separate and dedicated contact, which is the Vactive Measurement Anode Contact 216; and a unified (or integrated, or monolithic, or dual-purpose) Contact 217 operates as a unified Cathode Contact and Vactive Measurement Cathode Contact. Accordingly, laser unit 300A enables direct and accurate measurement of the Vactive voltage, as the voltage or the difference of potentials between: (i) the supplemental Vactive Measurement Anode Contact 216 and (ii) the unified Cathode Contact and Vactive Measurement Cathode Contact 217. In some embodiments, this structure may enable reduction in form-factor or volume or foot-print or cost of the laser unit and/or of it parts.

Embodiments of the present invention may comprise other laser units, in which only a single Supplemental Vactive Measurement Anode Contact it added or inserted or is utilized for the p-type side; whereas the n-type side (the Cathode) contact is common or unified to both the laser functionality and the Vactive voltage measurement functionality.

Embodiments of the present invention may comprise a monolithic multiple-laser array or batch or matrix, or other monolithic multiple-VCSEL structure or unit, in which a self-mix monitor pad is (or multiple such SM monitor pads are) provided for each individual laser (or VCSEL) in the array, and which enables direct or efficient or accurate measurement of the Vactive voltage of each such VCSEL (e.g., for purposes of laser self-mix signal characterization or analysis).

Figure 3B:
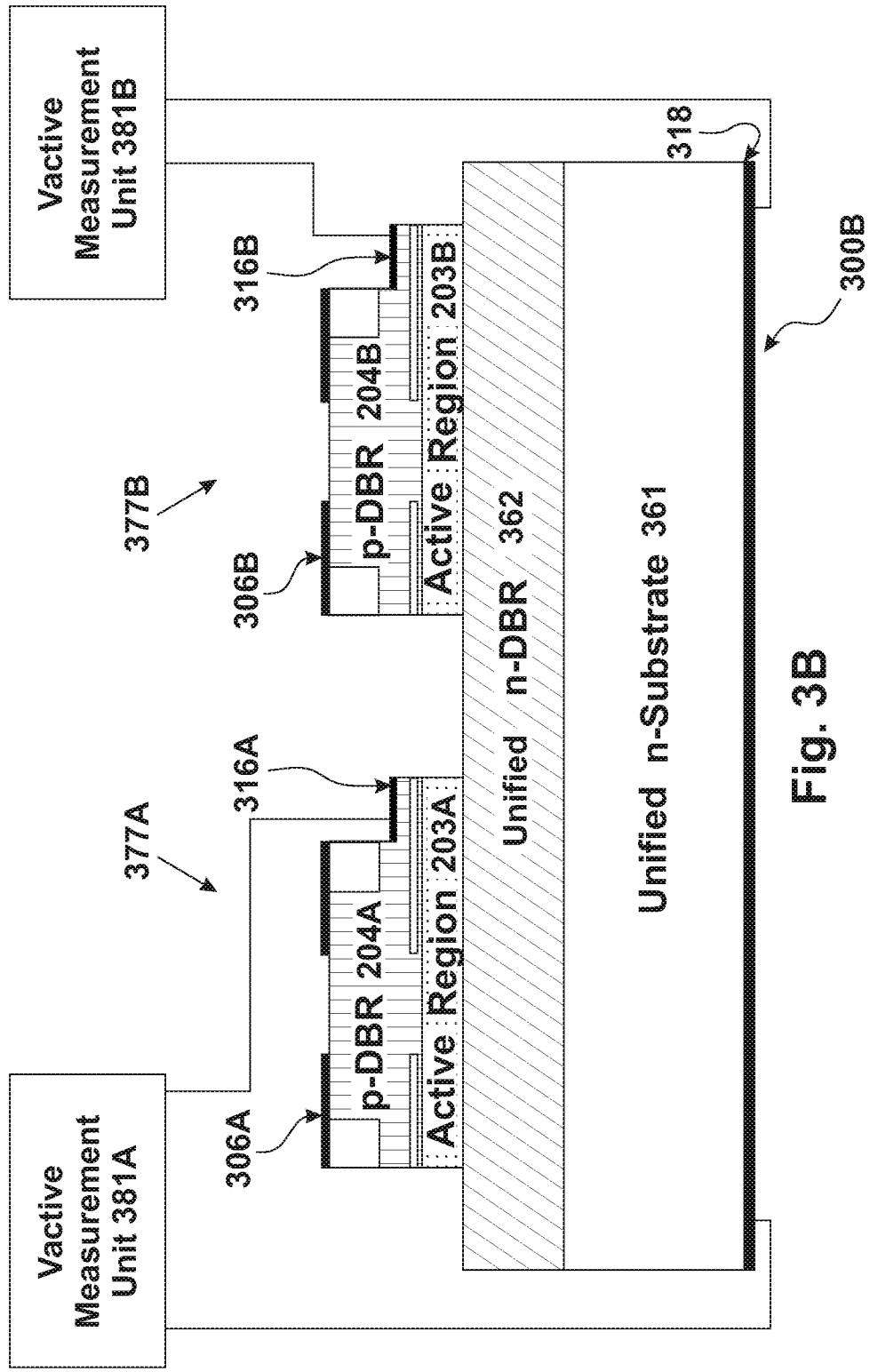
FIG. 3B is a schematic illustration of a multiple-VCSEL unit, in accordance with some demonstrative embodiments of the present invention.

For example, reference is made to FIG. 3B, which is a schematic illustration of a multiple-VCSEL unit 300B in accordance with some demonstrative embodiments of the present invention. Unit 300B may comprise two (or more) VCSEL units 377A-377B or laser units, each one of them may be generally similar to laser unit 300A; however, they are monolithically integrated, such that they share a single (e.g., elongated) unified n-side DBR 362, and they share a single (e.g., elongated) unified n-substrate 361, and they further share a single (e.g., elongated) Unified Cathode Contact and Vactive Measurement Cathode Contact 318.

Furthermore, VCSEL unit 377A has its Anode Contact 306A, and its Supplemental Vactive Measurement Anode Contact 316A; thereby enabling a Vactive Measurement Unit 381A to directly and accurately measure the Vactive voltage between: (i) the Supplemental Vactive Measurement Anode Contact 316A, and (ii) the Unified Cathode Contact and Vactive Measurement Cathode Contact 318; thereby enabling characterization and spectral analysis of the laser self-mix signal of VCSEL unit 377A, without an MPD.

Similarly, VCSEL unit 377B has its Anode Contact 306B, and its Supplemental Vactive Measurement Anode Contact 316B; thereby enabling a Vactive Measurement Unit 381B to directly and accurately measure the Vactive voltage between: (i) the Supplemental Vactive Measurement Anode Contact 316B, and (ii) the Unified Cathode Contact and Vactive Measurement Cathode Contact 318; thereby enabling characterization and spectral analysis of the laser self-mix signal of VCSEL unit 377B, without an MPD.

For demonstrative purposes, FIG. 3B depicts a multiple-VCSEL structure having two VCSEL sharing a monolithic Unified Cathode Contact and Vactive Measurement Cathode Contact 318, and sharing a unified n-substrate 361, and sharing a unified n-DBR 362; however, other suitable types or numbers of VCSEL may be similarly implemented in a single, monolithic, unified structure; for example, three VCSEL units arranged in a straight line or in a curved line or in a triangle structure, or four VCSEL units arranged in two rows and two columns, or four VCSEL units arranged in a straight line or in other structure, or six VCSEL units arranged as two columns and two rows, or nine VCSEL units arranged as a three-by-three grid, or the like.

In some embodiments, two (or more) Vactive voltage measurement pads or contacts, or Vactive voltage monitoring pads or contact, may be comprised for each VCSEL; in other embodiments, a combination of different VCSEL units may be utilized to form the multiple-VCSEL unit (e.g., formed as a monolithic unit, or an integrated unit), for example, a first VCSEL unit which has a single additional Vactive voltage measurement contact, whereas a second VCSEL unit has two additional Vactive voltage measurement contacts; other suitable combinations may be used.

It is noted that the laser units or VCSEL units of the present invention may be produced by any suitable method or process. For example, a selectively oxidized VCSEL may be produced. A multilayer system may be grown by solid-source molecular beam epitaxy on n-GaAs substrate. For emission wavelengths in the 980 nanometer (or 850 nanometer) spectral region, the active region consists of half-wavelength thick GaAs (or $Al_{0.2}Ga_{0.8}As$) with three, each 8 nanometer thick compressively strained $In_{0.2}Ga_{0.8}As$ (or unstrained GaAs) Quantum Wells separated by 10 nanometer barriers in the center. Quarter-wavelength $Al_{0.4}Ga_{0.6}As$ (or $Al_{0.5}Ga_{0.5}As$) cladding layers may be introduced on both sides of the active region, to improve longitudinal carrier confinement and to make the inner region one wavelength thick. Top and bottom mirrors may contain $Al_{0.7}Ga_{0.3}As$—GaAs (or $Al_{0.9}Ga_{0.1}As$—$Al_{0.2}Ga_{0.8}As$) quarter-wavelength Bragg stacks. Single-step grading with 5 nanometer thick layers of intermediate bandgap energy may be used to reduce the electrical series resistance. Current is supplied through the carbon p-doped top and silicon n-doped bottom reflectors, where modulation and Delta Doping may be required for high performance devices. Current confinement may be achieved by means of selective lateral oxidation of an about 30 nanometer thick AlAs layer placed directly above the top cladding layer. Oxidation may be done in an about 400 degrees Celsius hot water vapor atmosphere, leading to lateral oxidation rates in the range of 1 micrometer/minute. Semiconductor layers with lower Al content may have lower or much lower oxidation rates. Before oxidation, a mesa may be formed by wet or dry etching. Applying TiPtAu top and AuGeNi bottom ring contacts, simultaneous top and bottom laser emission from InGaAs Quantum Wells may be obtained. The etched mesa size may be selected several tens of micrometer larger than the envisaged active diameter, which may be adjusted from, for example, 1 micrometer to 100 micrometer or above 100 micrometer by proper choice of mesa diameter and oxidation time. Other suitable production methods may be used, with other materials and/or values.

In some embodiments, the Vactive Measurement Cathode Contact 215 (the Anode-M) and the Cathode-M and the Vactive Measurement Anode Contact 216 (the Anode-M), directly touch the active layer (or the active region). In other embodiments, the Vactive Measurement Cathode Contact 215 (the Anode-M) and the Cathode-M and the Vactive Measurement Anode Contact 216 (the Anode-M), are located only 1 or 2 or 3 or 4 or 5 or 6 layers away from the active region.

In some embodiments, a non −n type substrate may be used, or a semi-insulating substrate may be used, or a non-doped substrate may be used.

In some embodiments, a VCSEL in accordance with the present invention may have reverse doping, such that the bottom is p-type whereas the top is n-type. In such implementations, the locations of the Vactive Measurement Cathode Contact 215 (the Anode-M) and the Cathode-M and the Vactive Measurement Anode Contact 216 (the Anode-M), may be adjusted respectively to enable the direct monitoring or the direct measurement of the Vactive voltage.

Figure 4:
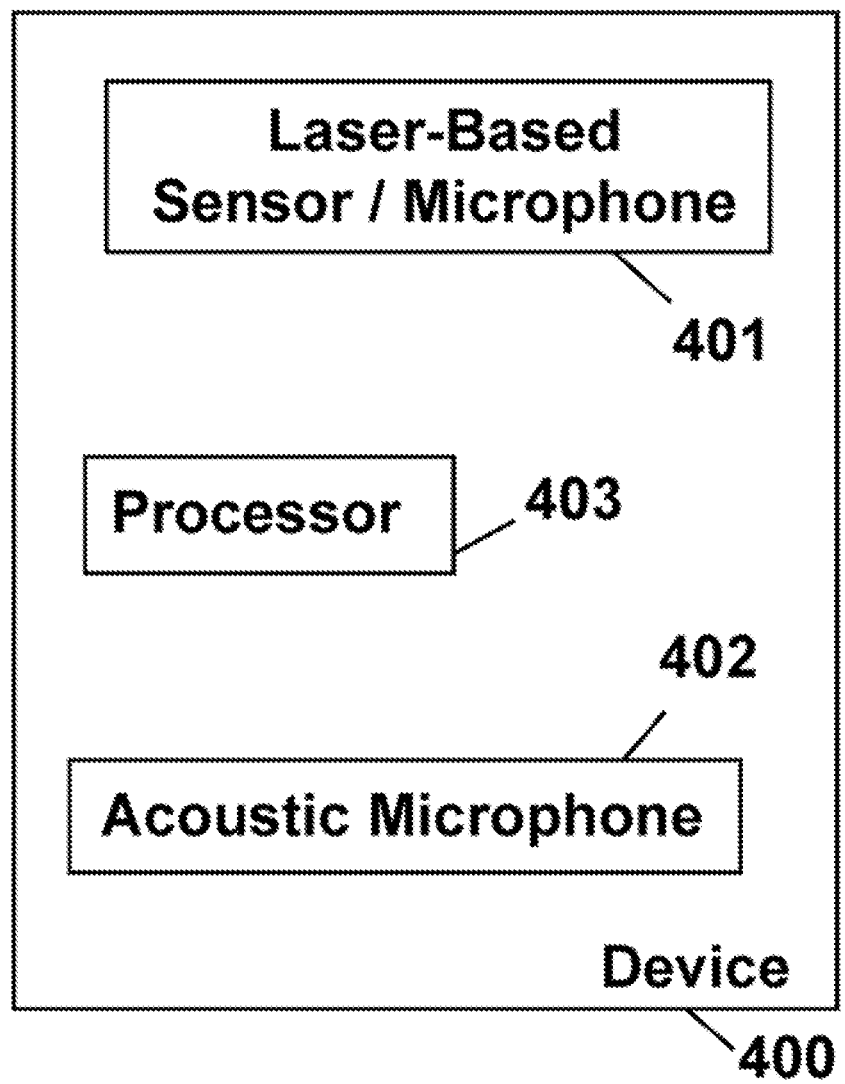
FIG. 4 is a schematic block-diagram illustration of a device, in accordance with some demonstrative embodiments of the present invention.

Reference is made to FIG. 4, which is a schematic block-diagram illustration of a device 400, in accordance with some demonstrative embodiments of the present invention. Device 400 may comprise: a laser-based sensor/microphone 401, which may comprise a laser unit similar to one or more of the laser unit(s) described above. Device 400 may optionally comprise also: an acoustic microphone 402 able to capture acoustic signals; and a processor 403 able to process acoustic signals captured by the acoustic microphone 402 and/or optical feedback received by (or the self-mix signal generated by) the laser-based sensor/microphone 401.

Device 400 may comprise one or more other suitable hardware components and/or software units, which are not shown in order to avoid over-crowding of the drawing; for example, a processor, a processor core, a CPU, a DSP, a GPU, a memory unit (e.g., RAM, Flash memory), a storage unit (e.g., hard disk drive, solid state drive), a wireless transceiver (e.g., Wi-Fi, Bluetooth, Zigbee, cellular), an antenna, an input unit (e.g., keyboard, keypad, touch-pad, touch-screen, on-screen keyboard, buttons, sliders, microphone, mouse, stylus), an output unit (screen, display unit, monitor, touch-screen, speakers), a power source (e.g., battery, rechargeable battery, power cell), accelerometer, gyroscope, compass, GPS unit, location-determining unit or sensor, an Operating System (OS), one or more applications or "apps", or the like.

Device 400 may be, or may comprise, or may be comprised in, for example: a smartphone, a cellular phone, a cordless phone, a tele-conference device or system, a video-conference device or system; an audio/video sensor; a computer, a laptop computer, a notebook computer, a desktop computer, a tablet, a gaming device, a gaming console, a navigation device, a mapping device, a route-guidance device; a vehicle, a motor vehicle, a self-driving vehicle, an autonomous vehicle; a vehicular dashboard, a vehicular component, a vehicular device, a vehicular dashboard device; an Augmented Reality (AR) gadget or gear or helmet or glasses or headset; a Virtual Reality (VR) gadget or gear or helmet or glasses or headset; a smart-watch; a fitness watch or device; a portable electronic device; a kiosk type device, an Automatic Teller Machine (ATM), an automated banking machine; a cash register, a Point-of-Sale (PoS) device; and/or other suitable device or system.

The term "acoustic microphone" as used herein, may comprise one or more acoustic microphone(s) and/or acoustic sensor(s); or a matrix or array or set or group or batch or arrangement of multiple such acoustic microphones and/or acoustic sensors; or one or more sensors or devices or units or transducers or converters (e.g., an acoustic-to-electric transducer or converter) able to convert sound into an electrical signal; a microphone or transducer that utilizes electromagnetic induction (e.g., a dynamic microphone) and/or capacitance change (e.g., a condenser microphone) and/or piezoelectricity (e.g., a piezoelectric microphones) in order to produce an electrical signal from air pressure variations; a microphone that may optionally be connected to, or may be associated with or may comprise also, a pre-amplifier or an amplifier; a carbon microphone; a carbon button microphone; a button microphone; a ribbon microphone; an electret condenser microphone; a capacitor microphone; a magneto-dynamic microphone; a dynamic microphone; an electrostatic microphone; a Radio Frequency (RF) condenser microphone; a crystal microphone; a piezo microphone or piezoelectric microphone; and/or other suitable types of audio microphones, acoustic microphones and/or sound-capturing microphones.

The term "laser microphone" as used herein, may comprise, for example: one or more laser microphone(s) or sensor(s); one or more laser-based microphone(s) or sensor(s); one or more optical microphone(s) or sensor(s); one or more microphone(s) or sensor(s) that utilize coherent electromagnetic waves; one or more optical sensor(s) or laser-based sensor(s) that utilize vibrometry, or that comprise or utilize a vibrometer; one or more optical sensor(s) and/or laser-based sensor(s) that comprise a self-mix module, or that utilize self-mixing interferometry measurement technique (or feedback interferometry, or induced-modulation interferometry, or backscatter modulation interferometry), in which a laser beam is reflected from an object, back into the laser, and the reflected light interferes with the light generated inside the laser, and this causes changes in the optical and/or electrical properties of the laser, and information about the target object and the laser itself may be obtained by analyzing these changes.

The terms "vibrating" or "vibrations" or "vibrate" or similar terms, as used herein, refer and include also any other suitable type of motion, and may not necessarily require vibration or resonance per se; and may include, for example, any suitable type of motion, movement, shifting, drifting, slanting, horizontal movement, vertical movement, diagonal movement, one-dimensional movement, two-dimensional movement, three-dimensional movement, or the like. In some embodiments, measuring or detecting or estimating "vibrations" of a target may include, for example, measuring or detecting or estimating a speed (or velocity) of movement of the target, or of the speed in which the skin of the target moves or vibrates, or other characteristics that characterize the movement or displacement or folding or skin or face-skin or body-skin when (or due to) speech uttered by a human speaker.

In some embodiments of the present invention, which may optionally utilize a laser microphone, only "safe" laser beams or sources may be used; for example, laser beam(s) or source(s) that are known to be non-damaging to human body and/or to human eyes, or laser beam(s) or source(s) that are known to be non-damaging even if accidently hitting human eyes for a short period of time. Some embodiments may utilize, for example, Eye-Safe laser, infra-red laser, infra-red optical signal(s), low-strength laser, and/or other suitable type(s) of optical signals, optical beam(s), laser beam(s), infra-red beam(s), or the like. It would be appreciated by persons of ordinary skill in the art, that one or more suitable types of laser beam(s) or laser source(s) may be selected and utilized, in order to safely and efficiently implement the system and method of the present invention.

In some embodiments which may optionally utilize a laser microphone or optical microphone, such optical microphone (or optical sensor) and/or its components may be implemented as (or may comprise) a Self-Mix module; for example, utilizing a self-mixing interferometry measurement technique (or feedback interferometry, or induced-modulation interferometry, or backscatter modulation interferometry), in which a laser beam is reflected from an object, back into the laser. The reflected light interferes with the light generated inside the laser, and this causes changes in the optical and/or electrical properties of the laser. Information about the target object and the laser itself may be obtained by analyzing these changes.

The present invention may be utilized in, or with, or in conjunction with, a variety of devices or systems that may benefit from noise reduction and/or speech enhancement; for example, a smartphone, a cellular phone, a cordless phone, a video conference system or device, a tele-conference system or device, an audio/video camera, a web-camera or web-cam, a landline telephony system, a cellular telephone system, a voice-messaging system, a Voice-over-IP system or network or device, a vehicle, a vehicular dashboard, a vehicular audio system or microphone, a navigation device or system, a vehicular navigation device or system, a mapping or route-guidance device or system, a vehicular route-guidance or device or system, a dictation system or device, Speech Recognition (SR) device or module or system, Automatic Speech Recognition (ASR) module or device or system, a speech-to-text converter or conversion system or device, a laptop computer, a desktop computer, a notebook computer, a tablet, a phone-tablet or "phablet" device, a gaming device, a gaming console, a wearable device, a smart-watch, a Virtual Reality (VR) device or helmet or glasses or headgear, an Augmented Reality (AR) device or helmet or glasses or headgear, a device or system or module that utilizes speech-based commands or audio commands, a device or system that captures and/or records and/or processes and/or analyzes audio signals and/or speech and/or acoustic signals, and/or other suitable systems and devices.

In some embodiments of the present invention, which may optionally utilize a laser microphone or optical microphone, the laser beam or optical beam may be directed to an estimated general-location of the speaker; or to a pre-defined target area or target region in which a speaker may be located, or in which a speaker is estimated to be located. For example, the laser source may be placed inside a vehicle, and may be targeting the general location at which a head of the driver is typically located. In other embodiments, a system may optionally comprise one or more modules that may, for example, locate or find or detect or track, a face or a mouth or a head of a person (or of a speaker), for example, based on image recognition, based on video analysis or image analysis, based on a pre-defined item or object (e.g., the speaker may wear a particular item, such as a hat or a collar having a particular shape and/or color and/or characteristics), or the like. In some embodiments, the laser source(s) may be static or fixed, and may fixedly point towards a general-location or towards an estimated-location of a speaker. In other embodiments, the laser source(s) may be non-fixed, or may be able to automatically move and/or change their orientation, for example, to track or to aim towards a general-location or an estimated-location or a precise-location of a speaker. In some embodiments, multiple laser source(s) may be used in parallel, and they may be fixed and/or moving.

In some demonstrative embodiments of the present invention, which may optionally utilize a laser microphone or optical microphone, the system and method may efficiently operate at least during time period(s) in which the laser beam(s) or the optical signal(s) actually hit (or reach, or touch) the face or the mouth or the mouth-region of a speaker. In some embodiments, the system and/or method need not necessarily provide continuous speech enhancement or continuous noise reduction; but rather, in some embodiments the speech enhancement and/or noise reduction may be achieved in those time-periods in which the laser beam(s) actually hit the face of the speaker. In other embodiments, continuous or substantially-continuous noise reduction and/or speech enhancement may be achieved; for example, in a vehicular system in which the laser beam is directed towards the location of the head or the face of the driver.

Although portions of the discussion herein relate, for demonstrative purposes, to wired links and/or wired communications, some embodiments are not limited in this regard, and may include one or more wired or wireless links, may utilize one or more components of wireless communication, may utilize one or more methods or protocols of wireless communication, or the like. Some embodiments may utilize wired communication and/or wireless communication.

The system(s) of the present invention may optionally comprise, or may be implemented by utilizing suitable hardware components and/or software components; for example, processors, processor cores, Central Processing Units (CPUs), Digital Signal Processors (DSPs), circuits, Integrated Circuits (ICs), controllers, memory units, registers, accumulators, storage units, input units (e.g., touch-screen, keyboard, keypad, stylus, mouse, touchpad, joystick, trackball, microphones), output units (e.g., screen, touch-screen, monitor, display unit, audio speakers), acoustic microphone(s) and/or sensor(s), optical microphone(s) and/or sensor(s), laser or laser-based microphone(s) and/or sensor(s), wired or wireless modems or transceivers or transmitters or receivers, GPS receiver or GPS element or other location-based or location-determining unit or system, network elements (e.g., routers, switches, hubs, antennas), and/or other suitable components and/or modules. The system(s) of the present invention may optionally be implemented by utilizing co-located components, remote components or modules, "cloud computing" servers or devices or storage, client/server architecture, peer-to-peer architecture, distributed architecture, and/or other suitable architectures or system topologies or network topologies.

In accordance with embodiments of the present invention, calculations, operations and/or determinations may be performed locally within a single device, or may be performed by or across multiple devices, or may be performed partially locally and partially remotely (e.g., at a remote server) by optionally utilizing a communication channel to exchange raw data and/or processed data and/or processing results.

In some embodiments, an apparatus comprises a hybrid acoustic-and-optical sensor which includes at least: a laser-based microphone able to remotely sense vibrations of a facial-area of a human speaker while said apparatus is not in physical contact with human speaker; and an acoustic microphone able to capture acoustic signals generated by said human speaker; wherein the apparatus further comprises a processor to enhance the acoustic signals, that are captured by said acoustic microphone, based on vibrations of the facial-area of the human speaker that are sensed remotely by the laser-based microphone.

In some embodiments, a device is or includes: a laser unit (e.g., a VCSEL unit, a self-mix laser unit) which comprises: a top-side p-type DBR region, which is on top of and in direct touch with an active region, which is on top of and in direct touch with a bottom-side n-type Distributed Bragg Reflector (DBR) region, which is on top of an n-type substrate; a voltage measurement anode that is either touching (e.g., directly touching) or is in proximity to a top surface of said active region; a voltage measurement cathode that is either touching (e.g., directly touching) or is in proximity to a bottom surface of said active region.

In some embodiments, the device comprises: a laser self-mix signal characterizer module, to determine one or more characteristics of said laser self-mix signal based on the voltage that is measured between said voltage measurement anode and said voltage measurement anode; wherein the laser unit excludes a Monitor Photo-Diode (MPD); wherein said laser self-mix signal characterizer module determines the one or more characteristics of said laser self-mix signal without receiving any signal from any MPD (or, independently from any MPD signals or MPD output; or, without utilizing any MPD signals or MPD output).

In some embodiments, an apparatus includes a laser unit (e.g., a self-mix laser unit, or a self-mix VCSEL unit), which comprises: a top-side p-type DBR region, which is on top of and in direct touch with an active region, which is on top of and in direct touch with a bottom-side n-type Distributed Bragg Reflector (DBR) region, which is on top of a n-type substrate; a voltage measurement anode that is touching (or is in proximity to) a top surface of said active region; a voltage measurement cathode that is touching (or is in proximity to) a bottom surface of said n-type substrate. In some embodiments, the apparatus further comprises: an active-voltage measurement unit, which is directly connected to said voltage measurement anode and to said voltage measurement cathode; wherein said active-voltage measurement unit is to directly measure a voltage between said voltage measurement anode and said voltage measurement cathode.

In some embodiments, a multiple-VCSEL self-mix laser system (e.g., a monolithic system) comprises a first VCSEL (e.g., self-mix) laser unit, and a second VCSEL (e.g., self-mix) laser unit. The first VCSEL laser unit comprises: a first top-side p-type DBR region, which is on top of and in direct touch with a first active region, which is on top of and in direct touch with (or, in proximity to) a cross-VCSEL unified bottom-side n-type Distributed Bragg Reflector (DBR) region, which is on top of a cross-VCSEL unified n-type substrate; a first voltage measurement anode that is either touching or is in proximity to a top surface of said first active region; a cross-VCSEL voltage measurement cathode touching a bottom surface of said cross-VCSEL unified n-type substrate. The second VCSEL laser unit comprises: a second top-side p-type DBR region, which is separate from the first top-side p-type DBR region; which is on top of and in direct touch with a second active region that is separate from the first active region, which is on top of and in direct touch with said cross-VCSEL unified bottom-side n-type Distributed Bragg Reflector (DBR) region, which is on top of said cross-VCSEL unified n-type substrate; a second voltage measurement anode that is either touching or is in proximity to a top surface of said second active region; and said cross-VCSEL voltage measurement cathode touching a bottom surface of said cross-VCSEL unified n-type substrate.

In some embodiments, the system further comprises: a first-VCSEL active-voltage measurement unit, which is directly connected to said first voltage measurement anode and to said cross-VCSEL voltage measurement cathode, wherein said first-VCSEL active-voltage measurement unit is to directly measure a first voltage between said first voltage measurement anode and said cross-VCSEL voltage measurement cathode; and, a second-VCSEL active-voltage measurement unit, which is directly connected to said second voltage measurement anode and to said cross-VCSEL voltage measurement cathode, wherein said second-VCSEL active-voltage measurement unit is to directly measure a second voltage between said second voltage measurement anode and said cross-VCSEL voltage measurement cathode.

In some embodiments, the first VCSEL laser unit transmits a first outgoing laser beam towards a remote target, and receives a first optical feedback signal that is reflected back from said remote target; wherein the first outgoing laser beam and the first reflected optical feedback signal perform self-mix in said first VCSEL laser unit and produce a first-VCSEL self-mix signal in said first VCSEL laser unit; wherein the first VCSEL laser unit further comprises: a first-VCSEL laser self-mix signal characterizer module, to determine one or more characteristics of said first-VCSEL self-mix signal based on the voltage that is measured between said first-VCSEL voltage measurement anode and said cross-VCSEL voltage measurement cathode; wherein the second VCSEL laser unit transmits a second outgoing laser beam towards said remote target, and receives a second optical feedback signal that is reflected back from said remote target; wherein the second outgoing laser beam and the second reflected optical feedback signal perform self-mix in said second VCSEL laser unit and produce a second-VCSEL self-mix signal in said second VCSEL laser unit; wherein the second VCSEL laser unit further comprises: a second-VCSEL laser self-mix signal characterizer module, to determine one or more characteristics of said second-VCSEL self-mix signal based on the voltage that is measured between said second-VCSEL voltage measurement anode and said cross-VCSEL voltage measurement cathode.

In some embodiments, the system excludes any Monitor Photo-Diode (MPD) units; wherein said first-VCSEL laser self-mix signal characterizer module determines the one or more characteristics of said first-VCSEL laser self-mix signal without receiving any signal from any MPD; wherein said second-VCSEL laser self-mix signal characterizer module determines the one or more characteristics of said second-VCSEL laser self-mix signal without receiving any signal from any MPD.

In some embodiments, a device is (or includes) a self-mix laser unit comprising: an active region having a first side and a second, opposite, side; a p-type DBR region, which is in direct touch with said first side of said active region; an n-type Distributed Bragg Reflector (DBR) region, which is in direct touch with said second side of said active region; an n-type substrate; a voltage measurement anode that is either touching or is in proximity to said first side of said active region; a voltage measurement cathode that is either touching or is in proximity to said second side of said active region.

In some embodiments, the device further comprises: an active-voltage measurement unit, which is directly connected to said voltage measurement anode and to said voltage measurement cathode, wherein said active-voltage measurement unit is to directly measure a voltage between said voltage measurement anode and said voltage measurement cathode.

In some embodiments, said self-mix laser unit transmits an outgoing laser beam towards a remote target, and receives an optical signal reflected back from said remote target; wherein the outgoing laser beam and the reflected optical signal perform self-mix in said self-mix laser unit and produce a laser self-mix signal in said self-mix laser unit.

In some embodiments, the device comprises: a laser self-mix signal characterizer module, to determine one or more characteristics of said laser self-mix signal based on the voltage that is measured between said voltage measurement anode and said voltage measurement cathode. In some embodiments, the voltage measurement anode is located at a stepped recess of said p-type DBR region. Additionally or alternatively, the voltage measurement cathode is located at a stepped recess (e.g., another stepped recess) of said active region.

In some embodiments, wherein the voltage measurement anode is generally-parallel to a surface of said active region; and/or, the voltage measurement cathode is generally-parallel to the surface of said active region.

In some embodiments, the voltage measurement anode is slanted and is non-parallel relative to a surface of said active region; and/or the voltage measurement cathode is slanted and is non-parallel relative to said surface of said active region.

In some embodiments, D1 denotes a distance between the voltage measurement anode and a top surface (or a top side, or a top edge, or a top tip) of said active region; D2 denotes a distance between the voltage measurement anode and a top-surface (or a top side, or a top edge, or a top tip) of the p-DBR region; D3 denotes a distance between the voltage measurement cathode and a bottom-surface (or a bottoms side, or a bottom edge, or a bottom tip) of the active region; D4 denotes a distance between the voltage measurement cathode and a bottom-surface surface (or a bottoms side, or a bottom edge, or a bottom tip) of the n-DBR region.

In some embodiments, the ratio of D1 to D1+D2 is smaller than 0.25, or is smaller than 0.33, or is smaller than 0.20, or is smaller than 0.15, or is smaller than 0.10, or is smaller than 0.05 or is in the range of 0.05 to 0.33, or is in the range of 0.05 to 0.25, or is in the range of 0.05 to 0.15, or is in the range of 0 to 0.33, or is in the range of 0 to 0.25, or is in the range of 0 to 0.15, or is in the range of 0 to 0.10. In some embodiments, additionally or alternatively, the ratio of D3 to D3+D4 is smaller than 0.25, or is smaller than 0.33, or is smaller than 0.20, or is smaller than 0.15, or is smaller than 0.10, or is smaller than 0.05 or is in the range of 0.05 to 0.33, or is in the range of 0.05 to 0.25, or is in the range of 0.05 to 0.15, or is in the range of 0 to 0.33, or is in the range of 0 to 0.25, or is in the range of 0 to 0.15, or is in the range of 0 to 0.10.

In some embodiments, the p-DBR region is formed of a particular number of layers which is between 24 layers and 36 layers; wherein each layer of the p-DBR region has a layer thickness which is $1/(4\ ni)$ of a wavelength of a laser beam generated by said laser unit, wherein ni is the index of refraction of each layer.

In some embodiments, the n-DBR region is formed of a particular number of layers which is between 24 layers and 36 layers; wherein each layer of the n-DBR region has a layer thickness which is 1/(4 ni) of a wavelength of a laser beam generated by said laser unit, wherein ni is the index of refraction of each layer.

In some embodiments, ni denotes the fixed index of refraction of each layer of the n-DBR region (or, respectively, of the p-DBR region). In other embodiments, the n-DBR region (or the p-DBR region) is formed of multiple sub-layers, each one having its own index of refraction, and in such case ni denotes the average value of those index-of-refraction values for the corresponding region (e.g., the n-DBR region, or the p-DBR region).

In some embodiments, D1 denotes a distance between the voltage measurement anode and a top surface (or top side, or top edge, or top tip) of said active region; wherein each i-layer of the p-DBR region has a layer thickness $L_i$ which is 1/(4 ni) of a wavelength of a laser beam generated by said laser unit or said laser device; wherein D1 has a value selected from the group consisting of: 0, $L_1$, $L_1+L_2$, $L_1+L_2+L_3$, $L_1+L_2+L_3+L_4$, $L_1+L_2+L_3+L_4+L_5$, $L_1+L_2+L_3+L_4+L_5+L_6$.

In some embodiments, D3 denotes a distance between the voltage measurement cathode and a bottom-surface (or bottom side, or bottom edge, or bottom tip) of the active region; wherein each i-layer of the n-DBR region has a layer thickness $L_i$ which is 1/(4 ni) of a wavelength of a laser beam generated by said laser unit or laser device; wherein D3 has a value selected from the group consisting of: 0, $L_1$, $L_1+L_2$, $L_1+L_2+L_3$, $L_1+L_2+L_3+L_4$, $L_1+L_2+L_3+L_4+L_5$, $L_1+L_2+L_3+L_4+L_5+L_6$.

In some embodiments, D1 denotes a distance between the voltage measurement anode and a top surface of said active region; wherein D1 has a value that is greater than 179 nanometers and is smaller than 301 nanometers; or, wherein D1 is in the range of 180 to 300 nanometers; or, wherein D1 is in the range of 150 to 250 nanometers; or, wherein D1 is in the range of 100 to 250 nanometers; or, wherein D1 is in the range of 50 to 250 nanometers; or, wherein D1 is in the range of 0 to 250 nanometers.

In some embodiments, D3 denotes a distance between the voltage measurement cathode and a bottom-surface of the active region; wherein D3 has a value that is greater than 179 nanometers and is smaller than 301 nanometers; or, wherein D3 is in the range of 180 to 300 nanometers; or, wherein D3 is in the range of 150 to 250 nanometers; or, wherein D3 is in the range of 100 to 250 nanometers; or, wherein D3 is in the range of 50 to 250 nanometers; or, wherein D3 is in the range of 0 to 250 nanometers.

In some embodiments, the above mentioned values and/or ratios of distance(s), of D1 and/or of D3, may be examples in which a Measurement Anode or a Measurement Cathode is either "directly touching" (distance=0) or is "in proximity to" the active region (or, to the nearest surface or nearest edge or nearest side or nearest tip of the active region).

In some embodiments, the device comprises a laser self-mix signal characterizer module, to determine one or more characteristics of said laser self-mix signal based on the voltage that is measured between said voltage measurement anode and said voltage measurement cathode; wherein the laser unit excludes a Monitor Photo-Diode (MPD), wherein said laser self-mix signal characterizer module determines the one or more characteristics of said laser self-mix signal without receiving any signal from any MPD.

In some embodiments, the device is a laser-based microphone.

In some embodiments, the device is a hybrid optical-and-acoustic sensor which comprises a laser-based microphone and an acoustic microphone.

In some embodiments, an apparatus is (or includes, or comprises) a self-mix laser unit comprising: an active region having a first side and a second, opposite, side; a p-type DBR region, which is in direct touch with said first side of said active region; an n-type Distributed Bragg Reflector (DBR) region, which is in direct touch with said second side of said active region; an n-type substrate; a voltage measurement anode that is either touching or is in proximity to said first side of said active region; a voltage measurement cathode that is either touching or is in proximity to said second side of said n-type substrate.

In some embodiments, the apparatus comprises: an active-voltage measurement unit, which is directly connected to said voltage measurement anode and to said voltage measurement cathode; wherein said active-voltage measurement unit is to directly measure a voltage between said voltage measurement anode and said voltage measurement cathode.

In some embodiments, the self-mix laser unit transmits an outgoing laser beam towards a remote target, and receives an optical signal reflected back from said remote target; wherein the outgoing laser beam and the reflected optical signal perform self-mix in said self-mix laser unit and produce a laser self-mix signal in said self-mix laser unit. In some embodiments, the apparatus further comprises: a laser self-mix signal characterizer module, to determine one or more characteristics of said laser self-mix signal based on the voltage that is measured between said voltage measurement anode and said voltage measurement cathode. In some embodiments, the self-mix laser unit excludes a Monitor Photo-Diode (MPD); and/or, said laser self-mix signal characterizer module determines the one or more characteristics of said laser self-mix signal without receiving any signal (or any output) from any MPD, and/or without being connected or operably associated with any MPD.

In some embodiments, a multiple-VCSEL (e.g., monolithic) self-mix laser system comprises a first VCSEL self-mix laser unit and a second (co-located, monolithically connected) VCSEL self-mix laser unit. The first VCSEL self-mix laser unit comprises a first-VCSEL active region, having a first side and a second, opposite, side; a first-VCSEL p-type DBR region, which is in direct touch with said first side of said first-VCSEL active region; a cross-VCSEL unified n-type Distributed Bragg Reflector (DBR) region, which is in direct touch with said second side of said first-VCSEL active region; a cross-VCSEL unified n-type substrate; a first voltage measurement anode that is either touching or is in proximity to the first side of said first-VCSEL active region; a cross-VCSEL voltage measurement cathode touching the second side of said cross-VCSEL unified n-type substrate. The second VCSEL self-mix laser unit comprises: a second-VCSEL active region, having a first side and a second, opposite, side; a second-VCSEL p-type DBR region, which is in direct touch with said first side of said second-VCSEL active region; said cross-VCSEL unified n-type Distributed Bragg Reflector (DBR) region, which is in direct touch with said second side of said second-VCSEL active region; said cross-VCSEL unified n-type substrate; a second voltage measurement anode that is either touching or is in proximity to the first side of said second-VCSEL active region; said cross-VCSEL voltage measurement cathode that is either touching or is in proximity to the second side of said cross-VCSEL unified n-type substrate.

In some embodiments, the system comprises: a first-VCSEL active-voltage measurement unit, which is directly connected to said first voltage measurement anode and to said cross-VCSEL voltage measurement cathode, wherein said first-VCSEL active-voltage measurement unit is to directly measure a first voltage between said first voltage measurement anode and said cross-VCSEL voltage measurement cathode. In some embodiments, the system comprises: a second-VCSEL active-voltage measurement unit, which is directly connected to said second voltage measurement anode and to said cross-VCSEL voltage measurement cathode, wherein said second-VCSEL active-voltage measurement unit is to directly measure a second voltage between said second voltage measurement anode and said cross-VCSEL voltage measurement cathode.

In some embodiments, the first VCSEL self-mix laser unit transmits a first outgoing laser beam towards a remote target, and receives a first optical feedback signal that is reflected back from said remote target; wherein the first outgoing laser beam and the first reflected optical feedback signal perform self-mix in said first VCSEL laser unit and produce a first-VCSEL self-mix signal in said first VCSEL self-mix laser unit; wherein the first VCSEL self-mix laser unit further comprises: a first-VCSEL laser self-mix signal characterizer module, to determine one or more characteristics of said first-VCSEL self-mix signal based on the voltage that is measured between said first-VCSEL voltage measurement anode and said cross-VCSEL voltage measurement cathode; wherein the second VCSEL self-mix laser unit transmits a second outgoing laser beam towards said remote target, and receives a second optical feedback signal that is reflected back from said remote target; wherein the second outgoing laser beam and the second reflected optical feedback signal perform self-mix in said second VCSEL self-mix laser unit and produce a second-VCSEL self-mix signal in said second VCSEL self-mix laser unit; wherein the second VCSEL self-mix laser unit further comprises: a second-VCSEL laser self-mix signal characterizer module, to determine one or more characteristics of said second-VCSEL self-mix signal based on the voltage that is measured between said second-VCSEL voltage measurement anode and said cross-VCSEL voltage measurement cathode.

In some embodiments, the system excludes any Monitor Photo-Diode (MPD) units; and/or, said first-VCSEL laser self-mix signal characterizer module determines the one or more characteristics of said first-VCSEL laser self-mix signal without receiving any signal from any MPD; and/or, said second-VCSEL laser self-mix signal characterizer module determines the one or more characteristics of said second-VCSEL laser self-mix signal without receiving any signal from any MPD.

Functions, operations, components and/or features described herein with reference to one or more embodiments of the present invention, may be combined with, or may be utilized in combination with, one or more other functions, operations, components and/or features described herein with reference to one or more other embodiments of the present invention. The present invention may thus comprise any possible or suitable combinations, re-arrangements, assembly, re-assembly, or other utilization of some or all of the modules or functions or components that are described herein, even if they are discussed in different locations or different chapters of the above discussion, or even if they are shown across different drawings or multiple drawings.

While certain features of some demonstrative embodiments of the present invention have been illustrated and described herein, various modifications, substitutions, changes, and equivalents may occur to those skilled in the art. Accordingly, the claims are intended to cover all such modifications, substitutions, changes, and equivalents.

What is claimed is:

1. A device comprising:
a self-mix laser unit comprising:
an active region having a first side and a second, opposite, side;
a p-type Distributed Bragg Reflector (DBR) region, which is in direct touch with said first side of said active region;
an n-type Distributed Bragg Reflector (DBR) region, which is in direct touch with said second side of said active region;
an n-type substrate;
a voltage measurement anode that is either touching or is in proximity to said first side of said active region;
a voltage measurement cathode that is either touching or is in proximity to said second side of said active region;
an active-voltage measurement unit, which is directly connected to said voltage measurement anode and to said voltage measurement cathode,
wherein said active-voltage measurement unit is to directly measure a voltage between said voltage measurement anode and said voltage measurement cathode;
wherein said self-mix laser unit transmits an outgoing laser beam towards a remote target, and receives an optical signal reflected back from said remote target;
wherein the outgoing laser beam and the reflected optical signal perform self-mix in said self-mix laser unit and produce a laser self-mix signal in said self-mix laser unit;
a laser self-mix signal characterizer module, to determine one or more characteristics of said laser self-mix signal based on the voltage that is measured between said voltage measurement anode and said voltage measurement cathode.

2. The device of claim 1,
wherein the voltage measurement anode is located at a stepped recess of said p-type DBR region.

3. The device of claim 1,
wherein the voltage measurement cathode is located at a stepped recess of said active region.

4. The device of claim 1,
wherein the voltage measurement anode is located at a stepped recess of said p-type DBR region; and wherein the voltage measurement cathode is located at a stepped recess of said active region.

5. The device of claim 1,
wherein the voltage measurement anode is generally-parallel to a surface of said active region;
wherein the voltage measurement cathode is generally-parallel to the surface of said active region.

6. The device of claim 1,
wherein D1 denotes a distance between the voltage measurement anode and a top surface of said active region;
wherein D2 denotes a distance between the voltage measurement anode and a top-surface of the p-DBR region;
wherein D3 denotes a distance between the voltage measurement cathode and a bottom-surface of the active region;
wherein D4 denotes a distance between the voltage measurement cathode and a bottom-surface of the n-DBR region;
wherein the ratio of D1 to D1+D2 is smaller than 0.25;
wherein the ratio of D3 to D3+D4 is smaller than 0.25.

7. The device of claim 1,
wherein D1 denotes a distance between the voltage measurement anode and a top surface of said active region;

wherein D2 denotes a distance between the voltage measurement anode and a top-surface of the p-DBR region;
wherein D3 denotes a distance between the voltage measurement cathode and a bottom-surface of the active region;
wherein D4 denotes a distance between the voltage measurement cathode and a bottom-surface of the n-DBR region;
wherein the ratio of D1 to D1+D2 is smaller than 0.15;
wherein the ratio of D3 to D3+D4 is smaller than 0.15.

8. The device of claim 1,
wherein the p-DBR region is formed of a particular number of layers which is between 24 layers and 36 layers;
wherein each layer of the p-DBR region has a layer thickness which is 1/(4 ni) of a wavelength of a laser beam generated by said laser unit,
wherein ni is the index of refraction of each layer.

9. The device of claim 1,
wherein the n-DBR region is formed of a particular number of layers which is between 24 layers and 36 layers;
wherein each layer of the n-DBR region has a layer thickness which is 1/(4 ni) of a wavelength of a laser beam generated by said laser unit,
wherein ni is the index of refraction of each layer.

10. The device of claim 1,
wherein D1 denotes a distance between the voltage measurement anode and a top surface of said active region;
wherein each i-layer of the p-DBR region has a layer thickness $L_i$ which is 1/(4 ni) of a wavelength of a laser beam generated by said laser unit;
wherein D1 has a value selected from the group consisting of:
0,
$L_1$,
$L_1+L_2$,
$L_1+L_2+L_3$,
$L_1+L_2+L_3+L_4$,
$L_1+L_2+L_3+L_4+L_5$,
$L_1+L_2+L_3+L_4+L_5+L_6$.

11. The device of claim 1,
wherein D3 denotes a distance between the voltage measurement cathode and a bottom-surface of the active region;
wherein each i-layer of the n-DBR region has a layer thickness $L_i$ which is 1/(4 ni) of a wavelength of a laser beam generated by said laser unit;
wherein D3 has a value selected from the group consisting of:
0,
$L_1$,
$L_1+L_2$,
$L_1+L_2+L_3$,
$L_1+L_2+L_3+L_4$,
$L_1+L_2+L_3+L_4+L_5$,
$L_1+L_2+L_3+L_4+L_5+L_6$.

12. The device of claim 1,
wherein D1 denotes a distance between the voltage measurement anode and a top surface of said active region;
wherein D1 has a value that is greater than 179 nanometers and is smaller than 301 nanometers.

13. The device of claim 1,
wherein D3 denotes a distance between the voltage measurement cathode and a bottom-surface of the active region;
wherein D3 has a value that is greater than 179 nanometers and is smaller than 301 nanometers.

14. The device of claim 1,
wherein the self-mix laser unit excludes a Monitor Photo-Diode (MPD),
wherein said laser self-mix signal characterizer module determines the one or more characteristics of said laser self-mix signal without receiving any signal from any MPD.

15. The device of claim 1,
wherein the device is a laser-based microphone.

16. The device of claim 1,
wherein the device is a hybrid optical-and-acoustic sensor which comprises a laser-based microphone and an acoustic microphone.

17. A device comprising:
a self-mix laser unit comprising:
an active region having a first side and a second, opposite, side;
a p-type Distributed Bragg Reflector (DBR) region, which is in direct touch with said first side of said active region;
an n-type Distributed Bragg Reflector (DBR) region, which is in direct touch with said second side of said active region;
an n-type substrate;
a voltage measurement anode that is either touching or is in proximity to said first side of said active region;
a voltage measurement cathode that is either touching or is in proximity to said second side of said active region;
wherein the voltage measurement anode is slanted and is non-parallel relative to a surface of said active region;
wherein the voltage measurement cathode is slanted and is non-parallel relative to said surface of said active region.

18. The device of claim 17,
wherein the device is a laser-based microphone.

19. The device of claim 17,
wherein the device is a hybrid optical-and-acoustic sensor which comprises a laser-based microphone and an acoustic microphone.

20. A multiple Vertical Cavity Surface Emitting Laser (multiple-VCSEL) system comprising:
a first VCSEL self-mix laser unit, which is monolithically co-located with a second VCSEL self-mix laser unit;
(I) wherein the first VCSEL self-mix laser unit comprises:
a first-VCSEL active region, having a first side and a second, opposite, side;
a first-VCSEL p-type Distributed Bragg Reflector (DBR) region, which is in direct touch with said first side of said first-VCSEL active region;
a cross-VCSEL unified n-type Distributed Bragg Reflector (DBR) region, which is in direct touch with said second side of said first-VCSEL active region;
a cross-VCSEL unified n-type substrate;
a first voltage measurement anode that is either touching or is in proximity to the first side of said first-VCSEL active region;
a cross-VCSEL voltage measurement cathode touching the second side of said cross-VCSEL unified n-type substrate;
(II) wherein the second VCSEL self-mix laser unit comprises:
a second-VCSEL active region, having a first side and a second, opposite, side;

a second-VCSEL p-type DBR region, which is in direct touch with said first side of said second-VCSEL active region;

said cross-VCSEL unified n-type DBR region, which is in direct touch with said second side of said second-VCSEL active region;

said cross-VCSEL unified n-type substrate;

a second voltage measurement anode that is either touching or is in proximity to the first side of said second-VCSEL active region;

said cross-VCSEL voltage measurement cathode that is either touching or is in proximity to the second side of said cross-VCSEL unified n-type substrate;

wherein said multiple-VCSEL system comprises:

a first-VCSEL active-voltage measurement unit, which is directly connected to said first voltage measurement anode and to said cross-VCSEL voltage measurement cathode, wherein said first-VCSEL active-voltage measurement unit is to directly measure a first voltage between said first voltage measurement anode and said cross-VCSEL voltage measurement cathode;

a second-VCSEL active-voltage measurement unit, which is directly connected to said second voltage measurement anode and to said cross-VCSEL voltage measurement cathode, wherein said second-VCSEL active-voltage measurement unit is to directly measure a second voltage between said second voltage measurement anode and said cross-VCSEL voltage measurement cathode.

21. The multiple-VCSEL system of claim 20, wherein the first VCSEL self-mix laser unit transmits a first outgoing laser beam towards a remote target, and receives a first optical feedback signal that is reflected back from said remote target;

wherein the first outgoing laser beam and the first reflected optical feedback signal perform self-mix in said first VCSEL laser unit and produce a first-VCSEL self-mix signal in said first VCSEL self-mix laser unit;

wherein the first VCSEL self-mix laser unit further comprises: a first-VCSEL laser self-mix signal characterizer module, to determine one or more characteristics of said first-VCSEL self-mix signal based on the voltage that is measured between said first-VCSEL voltage measurement anode and said cross-VCSEL voltage measurement cathode;

wherein the second VCSEL self-mix laser unit transmits a second outgoing laser beam towards said remote target, and receives a second optical feedback signal that is reflected back from said remote target;

wherein the second outgoing laser beam and the second reflected optical feedback signal perform self-mix in said second VCSEL self-mix laser unit and produce a second-VCSEL self-mix signal in said second VCSEL self-mix laser unit;

wherein the second VCSEL self-mix laser unit further comprises: a second-VCSEL laser self-mix signal characterizer module, to determine one or more characteristics of said second-VCSEL self-mix signal based on the voltage that is measured between said second-VCSEL voltage measurement anode and said cross-VCSEL voltage measurement cathode.

22. The multiple-VCSEL system of claim 21, wherein the system excludes any Monitor Photo-Diode (MPD) units, wherein said first-VCSEL laser self-mix signal characterizer module determines the one or more characteristics of said first-VCSEL laser self-mix signal without receiving any signal from any MPD;

wherein said second-VCSEL laser self-mix signal characterizer module determines the one or more characteristics of said second-VCSEL laser self-mix signal without receiving any signal from any MPD.

23. The multiple-VCSEL system of claim 20, wherein said multiple-VCSEL system is a laser-based microphone.

24. The multiple-VCSEL system of claim 20, wherein said multiple-VCSEL system is a hybrid optical-and-acoustic sensor which comprises a laser-based microphone and an acoustic microphone.

* * * * *